(12) United States Patent
Kato (10) Patent No.: US 10,054,301 B2
(45) Date of Patent: Aug. 21, 2018

(54) LIGHTING DEVICE AND LIGHTING APPLIANCE HAVING THE LIGHTING DEVICE

(71) Applicant: DENSO CORPORATION, Kariya, Aichi-pref. (JP)

(72) Inventor: Koichi Kato, Kariya (JP)

(73) Assignee: DENSO CORPORATION, Kariya (JP)

( * ) Notice: Subject to any disclaimer, the term of this patent is extended or adjusted under 35 U.S.C. 154(b) by 491 days.

(21) Appl. No.: 14/889,169

(22) PCT Filed: Sep. 2, 2014

(86) PCT No.: PCT/JP2014/004486
§ 371 (c)(1),
(2) Date: Nov. 5, 2015

(87) PCT Pub. No.: WO2015/040805
PCT Pub. Date: Mar. 26, 2015

(65) Prior Publication Data
US 2016/0131349 A1 May 12, 2016

(30) Foreign Application Priority Data

Sep. 18, 2013 (JP) .................. 2013-193395

(51) Int. Cl.
| H01J 1/02 | (2006.01) |
| F21V 23/00 | (2015.01) |
| F21V 29/503 | (2015.01) |
| H05B 33/08 | (2006.01) |
| F21V 29/70 | (2015.01) |

(Continued)

(52) U.S. Cl.
CPC .......... *F21V 23/005* (2013.01); *F21V 29/503* (2015.01); *F21V 29/70* (2015.01); *H05B 33/0815* (2013.01); *F21V 29/60* (2015.01); *F21Y 2115/10* (2016.08); *H01L 2224/48091* (2013.01); *Y02B 20/346* (2013.01)

(58) Field of Classification Search
CPC .............................. F21V 29/70; F21V 29/503
USPC ....................................... 313/46, 45
See application file for complete search history.

(56) References Cited

U.S. PATENT DOCUMENTS

| 5,893,623 A | 4/1999 | Muramatsu |
| 2011/0103076 A1 | 5/2011 | Beck et al. |

(Continued)

FOREIGN PATENT DOCUMENTS

| JP | 2002-304902 A | 10/2002 |
| JP | 2003-304026 A | 10/2003 |

(Continued)

OTHER PUBLICATIONS

International Search Report and Written Opinion of the International Searching Authority dated Nov. 25, 2014 for the corresponding international application No. PCT/JP2014/004486(and English translation).

*Primary Examiner* — Vip Patel
(74) *Attorney, Agent, or Firm* — Posz Law Group, PLC (57) ABSTRACT

A lighting device includes: a light source; a drive circuit that drives the light source to emit a light, and includes a circuit element and a circuit board, on which the circuit element and the light source are arranged; and a case that covers the drive circuit. The circuit board includes a radiation member, disposed in a region where the light source is arranged, for radiating heat generated from the light source. The case is connected with the circuit element, and radiates heat generated from the circuit element.

8 Claims, 8 Drawing Sheets

(51) Int. Cl.
  *F21V 29/60*  (2015.01)
  *F21Y 115/10*  (2016.01)

(56) References Cited

U.S. PATENT DOCUMENTS

2012/0161633 A1  6/2012  Nishitani et al.
2012/0314436 A1  12/2012  Inoue et al.

FOREIGN PATENT DOCUMENTS

| JP | 2007-012856 A | 1/2007 |
| JP | 2007-035788 A | 2/2007 |
| JP | 2008-135235 A | 6/2008 |
| JP | 2009-231135 A | 10/2009 |
| JP | 2010-049830 A | 3/2010 |
| JP | 2012-123924 A | 6/2012 |
| JP | 2012-174436 A | 9/2012 |

LIGHTING DEVICE AND LIGHTING APPLIANCE HAVING THE LIGHTING DEVICE

CROSS REFERENCE TO RELATED APPLICATIONS

This application is a U.S. national stage of International Application No. PCT/JP2014/004486 filed on Sep. 2, 2014 and is based on Japanese Patent Application No. 2013-193395 filed on Sep. 18, 2013, the disclosures of which are incorporated herein by reference.

TECHNICAL FIELD

The present disclosure relates to a lighting device and a lighting appliance having the lighting device.

BACKGROUND ART

Up to now, there is a lighting device disclosed in Patent Literature 1. In the lighting device, a light source (for example, LED) and a drive circuit (for example, an LED drive unit, a control unit) that drives the light source to emit a light are fitted to a heat sink. The heat sink radiates a heat generated by the light source during lighting, and also radiates a heat generated in the drive circuit.

As described above, the lighting device can radiate not only the heat generated by the light source during lighting, but also the heat generated in the driver circuit by the heat sink. However, in the lighting device, the light source and the drive circuit are fitted to the same heat sink. For that reason, in the lighting device, the heat generated by the light source during lighting is transmitted to circuit elements configuring the drive circuit through the heat sink. Hence, the lighting device has the potential to decrease the heat radiation of the circuit elements.

PRIOR ART LITERATURES

Patent Literature

Patent Literature 1: JP-2012-138294 A

SUMMARY OF INVENTION

It is an object of the present disclosure to provide a lighting device and a lighting appliance having the lighting device, which suppresses a reduction in the heat radiation of a circuit element while radiating the heat generated from a light source.

According to a first aspect of the present disclosure, a lighting device includes: a light source; a drive circuit that drives the light source to emit a light, and includes a circuit element and a circuit board, on which the circuit element and the light source are arranged; and a case that covers the drive circuit. The circuit board includes a radiation member, disposed in a region where the light source is arranged, for radiating heat generated from the light source. The case is connected with the circuit element, and radiates heat generated from the circuit element.

According to the above disclosure, both of the light source and the circuit element are implemented on the circuit board. The light source is implemented on the heat radiation member disposed on the circuit board. For that reason, the heat generated from the light source can be radiated through the heat radiation member. On the other hand, the circuit element is connected to the case. For that reason, the heat generated from the circuit element can be radiated through the case.

As described above, according to the above disclosure, a radiation path of the heat generated from the light source is separated from a radiation path of the heat generated from the circuit element. Hence, according to this disclosure, the heat generated from the light source can be restrained from being transmitted to the circuit element. Hence, according to this disclosure, a reduction in the heat radiation of the circuit element can be suppressed while the heat generated from the light source is radiated.

According to a second aspect of the present disclosure, a lighting appliance includes: the lighting device according to the first aspect; and the heat sink. The heat sink is an air-cooled heat sink, to which a wind is supplied from a cooling fan. The air-cooled heat sink includes a blowing hole, through which the wind supplied from the cooling fan passes, disposed at a position facing the circuit element, and a gap that communicates with the blowing hole, and is disposed between the air-cooled heat sink and the lighting device.

In the above lighting appliance, the heat radiation path of the heat generated from the light source is separated from the radiation path of the heat generated from the circuit element. Hence, according to this disclosure, the heat generated from the light source can be restrained from being transmitted to the circuit element. Hence, according to this disclosure, a reduction in the heat radiation of the circuit element can be suppressed while the heat generated from the light source is radiated.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinafter, multiple aspects for embodying this disclosure will be described with reference to the drawings. In the respective embodiments, a part that corresponds to a matter described in a preceding embodiment may be assigned the same reference numeral, and redundant explanation for the part may be omitted. When only a part of a configuration is described in the respective embodiments, another preceding embodiment may be applied to the other parts of the configuration.

As illustrated in FIGS. 1 to 5, a lighting device 100 includes a circuit unit 10, a light emitting unit 20, a case 60, and a cover 70. This disclosure can achieve its object even if the cover 70 is not provided.

Figure 5:
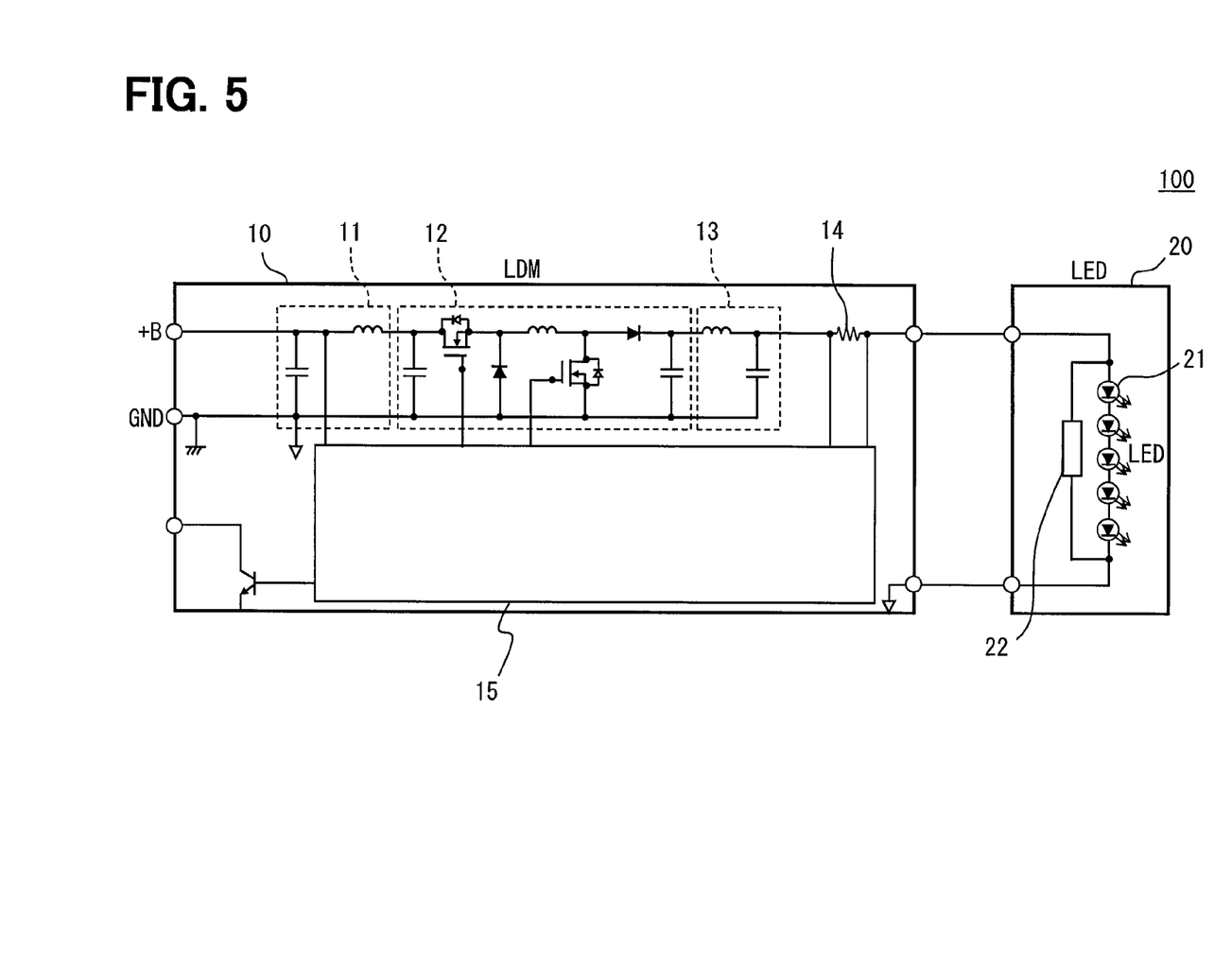
FIG. 5 is a circuit diagram illustrating schematic configurations of a drive circuit and a light emitting unit in the lighting device according to the embodiment.

The circuit unit 10 corresponds to a drive circuit. As illustrated in FIG. 5, the circuit unit 10 is electrically connected to the light emitting unit 20, and drives an LED 21 of the light emitting unit 20 to emit a light. The circuit unit 10 includes multiple circuit components such as an input filter 11, a DC/DC converter 12, an output filter 13, a detection resistor 14, and a control IC 15.

Each of the circuit components includes circuit elements such as a switching device (for example, MOSFET), a resistive element, a diode, a coil 16, and a capacitor. The control IC 15 that is a part of the circuit components is an integrated circuit formed into a chip, and therefore the control IC 15 per se can be regarded as a circuit element. A circuit configuration and operation of the circuit unit 10 are well-known, and a detailed description thereof will be omitted. The LED is an abbreviation for light emitting diode.

Figure 3:
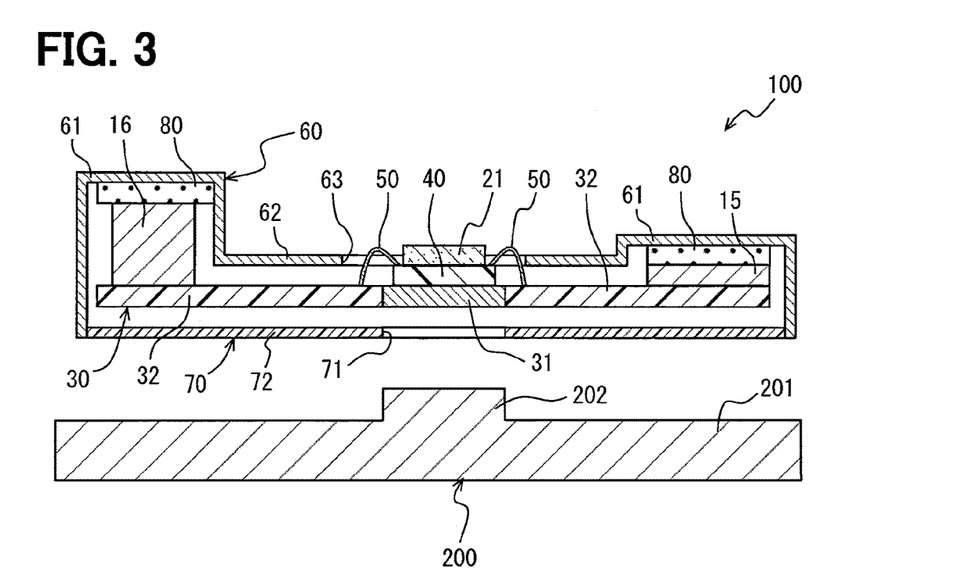
FIG. 3 is a cross-sectional view taken along a line of FIG. 1.

Now, a structure of the circuit unit 10 will be described. As illustrated in FIG. 3, the circuit unit 10 includes circuit elements configuring each circuit component, and a circuit board 30 on which the circuit elements are implemented. The circuit elements include, for example, the control IC 15 and the coil 16. In other words, the input filter 11, the DC/DC converter 12, the output filter 13, the detection resistor 14, and the control IC 15 are implemented on the circuit board 30. In this embodiment, the control IC 15 and the coil 16 are illustrated as the circuit elements. In the following description, the circuit element such as the control IC 15 or the coil 16 may be called merely "circuit element".

The circuit board 30 includes an insulating board base 32 made of resin or ceramic, and a conductor pattern made of metal which is disposed on the board base 32. The conductor pattern includes a circuit pattern, a pad, and a mounting land. The circuit pattern, the pad, and the mounting land are omitted from illustration.

The circuit elements as well as the LED 21 are implemented on the circuit board 30. That is, the circuit elements and the LED 21 are implemented on the same circuit board 30. In other words, the circuit elements and the LED 21 are implemented on one circuit board 30. As described in detail, the circuit elements and the LED 21 are implemented on the same surface of the circuit board 30. Hence, the circuit elements and the LED 21 are implemented on one surface side of the circuit board 30. For that reason, in the lighting device 100, the LED 21 and the circuit elements are implemented on one circuit board 30, and the LED 21 and the circuit unit 10 are integrated together.

As described above, the circuit elements and the LED 21 are implemented on the same surface of the circuit board 30, which can facilitates implementation more than a case in which the circuit elements and the LED 21 are implemented, on different surfaces of the circuit board 30. In other words, in this embodiment, a process of implementing the circuit elements and the LED 21 on the circuit board 30 can be simplified.

The LED 21 is implemented on a heat radiation member 31 through an insulating member 40 higher in heat conduction than the board base 32. In other words, the insulating member 40 is disposed on the heat radiation member 31. The LED 21 is implemented on the insulating member 40. The insulating member 40 can be made of, for example, aluminum nitride. In the insulating member 40, each of a surface on which the LED 21 is implemented and a surface facing the circuit board 30 is partially metalized. The insulating member 40 is connected to the LED 21 and the heat radiation member 31 through connection members such as solder. The insulating member 40 not shown is provided with a pad made of metal. The LED 21 and a protection member 22 are electrically connected to the pad of the insulating member 40. The pad of the insulating member 40 is electrically connected with leads 50.

The reason why the LED 21 is implemented on the heat radiation member 31 through the insulating member 40 is because the LED 21 and the heat radiation member 31 are electrically insulated from each other. An electrode is disposed on a surface of the LED 21 opposite to the circuit board 30. For that reason, when the LED 21 is implemented directly on the heat radiation member 31, the LED 21 and the heat radiation member 31 are electrically connected to each other. However, the LED 21 implemented on the insulating member 40 is implemented over the circuit board 30 in a state where the LED 21 is electrically insulated from the heat radiation member 31 through the insulating member 40. With the above configuration, even when the electrode is disposed on an opposite surface of the LED 21 to the circuit board 30, the LED 21 can be implemented on the heat radiation member 31. The insulating member 40 is made of a material such as aluminum nitride higher in heat conduction than the board base 32. With the above configuration, the insulating member 40 can electrically insulate the LED 21 and the heat radiation member 31 while the heat radiation of the LED 21 is restrained from being reduced. However, this disclosure is not limited to the above configuration. The LED 21 may be implemented on the heat radiation member 31 not through the insulating member 40 if the LED 21 is not electrically connected to the heat radiation member 31.

The respective circuit elements are electrically connected to each other through the circuit pattern disposed on the circuit board 30. As illustrated in FIG. 3, the circuit unit 10 is electrically connected to the LED 21 and the protection member 22 through the leads 50. With the above configuration, the circuit unit 10 and the light emitting unit 20 are configured as illustrated in FIG. 5.

Further, the circuit board 30 is provided with the heat radiation member 31 for radiating the heat generated from the LED 21 in a region where the LED 21 is implemented. In other words, the circuit board 30 has the heat radiation member 31 embedded in the board base 32. The heat radiation member 31 is made of metal such as copper or aluminum. In this example, the heat radiation member 31 is made of copper. However, the heat radiation member 31 is not limited to copper or aluminum. The heat radiation member 31 can be made of metal higher in heat conduction than a material of the board base 32 (in other words, higher in heat conductivity). The heat radiation member 31 can be made of a material containing metal. Further, the heat radiation member 31 may be made of a conductive paste containing conductive particles.

In more detail, the heat radiation member 31 is disposed to extend from a mounting surface of the circuit board 30 on which the LED 21 and the control IC 15 are implemented to an opposite surface to the mounting surface. The heat radiation member 31 can be embedded in the board base 32 by pressing copper inserted into a hole provided in the board base 32.

Although not shown, the circuit unit 10 has an input/output connector for connecting the circuit unit 10 per se to an external equipment of the lighting device 100. The external equipment is, for example, an electronic control device of a body system. In the lighting device 100, the input/output connector is mounted on the circuit board 30, and a power supply ground (not shown) provided on the circuit board 30 may be connected to the circuit pattern and the case 60 through the input/output connector. This configuration takes an EMC countermeasure of the lighting device 100.

Subsequently, the light emitting unit 20 will be described. As illustrated in FIG. 5, the light emitting unit 20 includes the LED 21 and the protection member 22 of the LED 21. The LED 21 corresponds to a light source. The LED 21 and the protection member 22 are well-known techniques, and their detailed description will be omitted.

Figure 1:
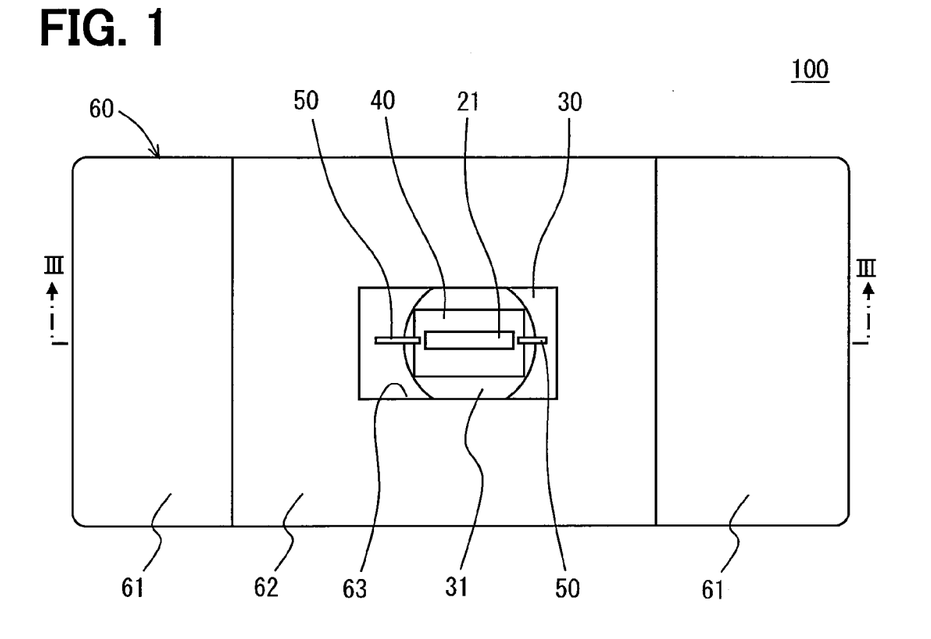
FIG. 1 is a top plan view illustrating a schematic configuration of a lighting device according to an embodiment.

Subsequently, the case 60 will be described. As illustrated in FIGS. 1 and 3, the case 60 covers the circuit unit 10. In detail, the case 60 partially covers the circuit unit 10. The case 60 is made of metal or a material containing metal. In other words, the case 60 may be made of metal such as copper or aluminum, or may be formed of a molded article including a conductive woven fabric into which a resin woven fabric is plated with metal.

Figure 2:
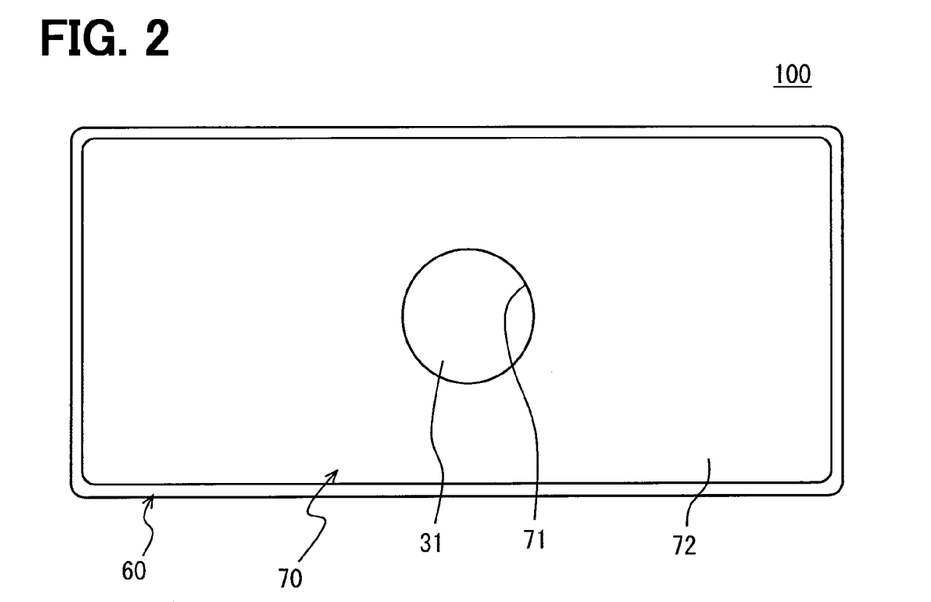
FIG. 2 is a bottom plan view illustrating the schematic configuration of the lighting device according to the embodiment.

FIG. 1 is a top plan view of the lighting device 100. The upper side means an upper side of a paper plane in FIG. 3. In other words, FIG. 1 is a plan view of a side of the lighting device 100 on which the LED 21 is implemented. On the contrary, FIG. 2 is a lower side plan view of the lighting device 100. The lower side means a lower side of the paper plane in FIG. 3. In other words, FIG. 2 is a plan view of a side of the lighting device 100 on which the LED 21 is not implemented, in other words, a side facing a heat sink 200.

The case 60 is a box-shaped member having a bottom surface and an annular side wall projected from an end of the bottom surface. The case 60 is opened at a position facing the bottom surface. In other words, the case 60 has an opening at the position facing the bottom surface. The bottom surface of the case 60 is, for example, a region above the paper plane in FIG. 3. Hence, a region illustrated in FIG. 1 is a surface opposite to the bottom surface.

As illustrated in FIGS. 1 and 3, the case 60 is provided with an irradiation window 63 through which a light emitted from the LED 21 passes. With the above configuration, the lighting device 100 can perform irradiation with the light emitted from the LED 21 through the irradiation window 63 even in a state where the circuit board 30 on which the LED 21 is implemented is covered with the case 60. The irradiation window 63 may be configured by a hole that penetrates through the case 60 in a thickness direction, or a region in which a transparent member is fitted to the hole. The LED 21 may be disposed within the irradiation window 63 that is a through-hole.

The case 60 is formed with convex portions 61 and a concave portion 62 according to the height of the circuit elements. The convex portions 61 are regions projected from the concave portion 62. Hence, the concave portion 62 is a region recessed from the convex portions 61. The concave portion 62 faces a region of the circuit board 30 on which the circuit element is not implemented. On the other hand, the convex portions 61 face the respective circuit elements implemented on the circuit board 30.

The case 60 radiates the heat generated from the circuit elements, and is connected to the circuit elements. The control IC 15, the coil 16, a capacitor, a diode, and a switching device, which are the circuit elements, may generate heat during the operation. With the connection of the circuit elements to the case 60, the lighting device 100 can radiate the heat generated from the circuit elements.

As described above, the case 60 functions as a heat radiation path of the circuit elements. In this disclosure, all of the circuit elements may not be connected to the case 60, and the object of this disclosure can be achieved even when a part of the circuit elements is connected to the case 60. As illustrated in FIG. 3, in this embodiment, the circuit elements are connected to the bottom surface of the case 60. However, this disclosure is not limited to this configuration. This disclosure can achieve the object even if the circuit elements are connected to a side wall of the case 60.

The case 60 is thermally isolated from the heat radiation member 31. In other words, the case 60 comes out of the heat radiation member 31, and is spaced apart from the heat radiation member 31. Hence, a space is provided between the case 60 and the heat radiation member 31. It is needless to say that the case 60 and the heat radiation member 31 are provided as different members. With the above configuration, the heat transmitted from the LED 21 to the heat radiation member 31 can be restrained from being transmitted to the circuit elements through the case 60.

In this embodiment, the circuit elements are connected to the case 60 through a circuit heat radiation agent 80. The circuit heat radiation agent 80 is a heat radiation grease or a heat radiation gel. The circuit heat radiation agent 80 is embedded in a gap between each of the circuit elements and the case 60, and decreases a thermal resistance that reaches the case 60 from the circuit element. For example, the circuit heat radiation agent 80 is disposed to completely cover a surface of the circuit element opposite to the bottom surface of the case 60. However, this disclosure is not limited to this configuration.

As described above, the case 60 and the circuit elements are connected to each other through the circuit heat radiation agent 80 with the result that the heat radiation of the circuit elements can be improved. This disclosure is not limited to this configuration. This disclosure can achieve the object even if the case 60 and the circuit elements are connected directly to each other.

Then, the cover 70 will be described. In the cover 70, a connection window 71 is provided in a cover base 72. As illustrated in FIGS. 2 and 3, the cover 70 is fitted to the case 60, and covers an opening of the case 60. The connection window 71 is provided at a position facing the heat radiation member 31 in a state where the cover 70 is fitted to the case 60. In other words, the cover 70 has a hole that passes through the cover 70 in a thickness direction of the cover 70 as the connection window 71. The connection window 71 is a hole for connecting the heat radiation member 31 to the heat sink 200 to be described later. The cover base 72 can be made of, for example, a resin low in heat conduction than metal. However, a material of the cover base 72 is not limited to the resin.

Figure 4:
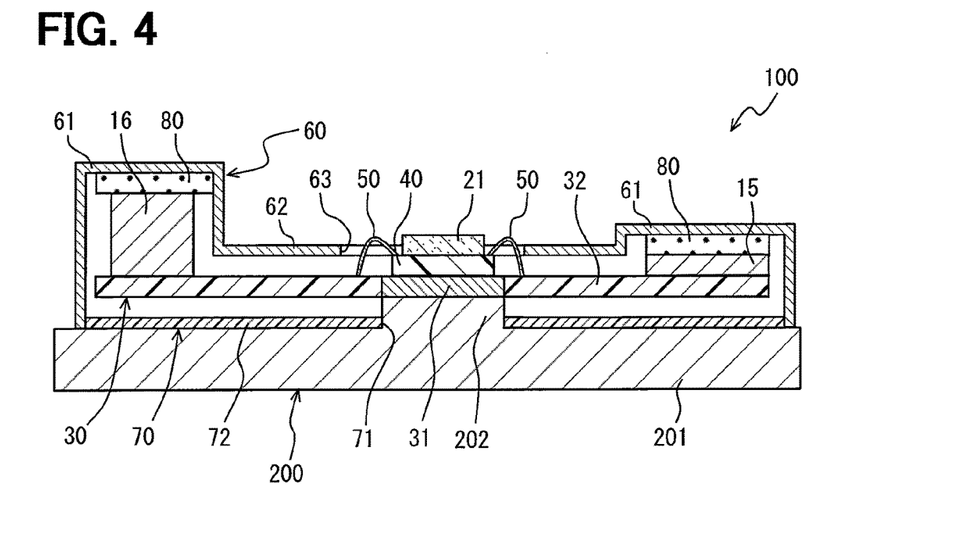
FIG. 4 is a cross-sectional view of a state in which the lighting device according to the embodiment is fitted to a heat sink.

As illustrated in FIGS. 3 and 4, the lighting device 100 configured as described above is preferably fitted to the heat sink 200. In this embodiment, the lighting device 100 fitted to the heat sink 200 is employed. However, this disclosure is not limited to this configuration. The object of this disclosure can be achieved even if the lighting device 100 is not fitted to the heat sink 200.

The heat sink 200 is made of metal such as copper or aluminum, and includes a heat sink base 201 and a connection convex portion 202 projected from a periphery. The connection convex portion 202 is a site connected to the heat radiation member 31. Hence, the connection convex portion 202 is inserted into the connection window 71, and connectable to the heat radiation member 31 in a state where the lighting device 100 is fitted to the heat sink 200. For that reason, in other words, the heat radiation member 31 is connected to the heat sink 200 through the connection window 71. The heat radiation member 31 has only to come in contact with the connection convex portion 202 so that the heat radiation member 31 can transmit the heat transmitted from the LED 21 to the heat sink 200.

With the connection of the heat radiation member 31 to the heat sink 200 as described above, the heat generated from the LED 21 is transmitted to the heat sink 200 through the heat radiation member 31, and radiated from the heat sink 200. Therefore, the lighting device 100 can improve the heat radiation of the LED 21.

The lighting device 100 is fitted to the heat sink 200 in a state where the cover 70 faces the heat sink 200. Hence, the cover 70 is disposed between the circuit board 30 and the heat sink 200 in a state where the lighting device 100 is fitted to the heat sink 200. In other words, the cover 70 is disposed between the lighting device 100 and the heat sink 200. In other words, the cover 70 is disposed in regions of the circuit elements implemented on the circuit board 30 opposite to the heat sink 200. However, in the lighting device 100, the connection window 71 is disposed in the cover 70. For that reason, in the lighting device 100, the heat sink 200 can be connected to the heat radiation member 31 although the cover 70 mediates between the circuit elements and the heat sink 200. Hence, in the lighting device 100, with the disposition of the cover 70 between the heat sink 200 and the circuit board 30, the heat transmitted from the LED 21 to the heat sink 200 can be restrained from being transmitted to the circuit elements through the circuit board 30. Therefore, the cover 70 functions as a heat insulating member between the circuit elements and the heat sink 200.

In this embodiment, the connection convex portion 202 is inserted into the connection window 71, and connected to the heat radiation member 31. However, this disclosure is not limited to this configuration. At least one of the heat radiation member 31 and the heat sink 200 may be inserted into the connection window 71 for connection between the heat radiation member 31 and the heat sink 200.

As described above, in the lighting device 100, both of the LED 21 and the circuit elements are implemented on the circuit board 30. The LED 21 is implemented on the heat radiation member 31 disposed in the circuit board 30. For that reason, the heat generated by the LED 21 can be radiated through the heat radiation member 31. On the other hand, the circuit elements are connected to the case 60. For that reason, the heat generated from the circuit elements can be radiated through the case 60.

As described above, in the lighting device 100, the radiation path of the heat generated from the LED 21 is separated from the radiation path of the heat generated from the circuit elements. In other words, in the lighting device 100, the heat radiation path is bisectioned into the radiation path of the heat generated from the LED 21 and the radiation path of the heat generated from the circuit elements.

For that reason, the lighting device 100 can restrain the heat generated from the LED 21 from being transmitted to the circuit elements. Therefore, the lighting device 100 can restrain a reduction in the heat radiation of the circuit elements while radiating the heat generated from the LED 21. In the lighting device 100, because a reduction in the heat radiation of the circuit elements can be suppressed, an improvement in the lifetime of the circuit elements can be expected. In particular, when the lighting device 100 is used at a high temperature, an improvement in the lifetime of the circuit elements can be expected. Because the lighting device 100 is separated into the heat radiation member 31 and the case 60, an improvement in the effect of the separation can be expected.

Further, with the integration of the LED 21 with the circuit unit 10, the lighting device 100 can reduce harnesses and connector components for connecting the LED 21 to the circuit unit 10. In other words, in the lighting device 100, the LED 21 can be connected to the circuit unit 10 by the leads 50 and the conductor pattern instead of the harnesses and the connector components. Hence, the lighting device 100 can save a mounting space as compared with a lighting device having the harnesses and the connector components for connecting the LED to the circuit unit.

The LED 21 can be applied to a vehicle head lamp. The vehicle head lamp may require a luminance higher than that of an illumination within a house. Hence, when the LED 21 is applied to the vehicle head lamp, an electric power of about dozens watts is applied to the LED 21, and most of the electric power is consumed as a heat. On the other hand, in the circuit unit 10, even if the LED 21 is applied to the vehicle head lamp, an electric power loss of about few watts merely occurs. However, the lighting device 100 can suppress a reduction in the heat radiation of the circuit elements while the heat generated from the LED 21 is radiated as described above. For that reason, the lighting device 100 is suitable for a case in which the LED 21 is applied to the vehicle head lamp.

The preferred embodiment of this disclosure has been described above. However, this disclosure is not limited to the above-mentioned embodiment, and can be variously modified without departing from the spirit of this disclosure. Modifications 1 to 5 of this disclosure will be described below. The above embodiment and Modifications 1 to 5 can be implemented, independently, but can be implemented in appropriate combination. This disclosure is not limited to the combination described in the embodiment for implementing this disclosure, but can be implemented by various combinations. Each of the lighting device 100 and lighting devices 110 to 150 described below may include heat sinks 200 to 220 and 240. In other words, each of the lighting device 100 and the lighting devices 110 to 150 described below may include the heat sinks 200 to 220 and 240 as one of components.

(Modification 1)

Figure 6:
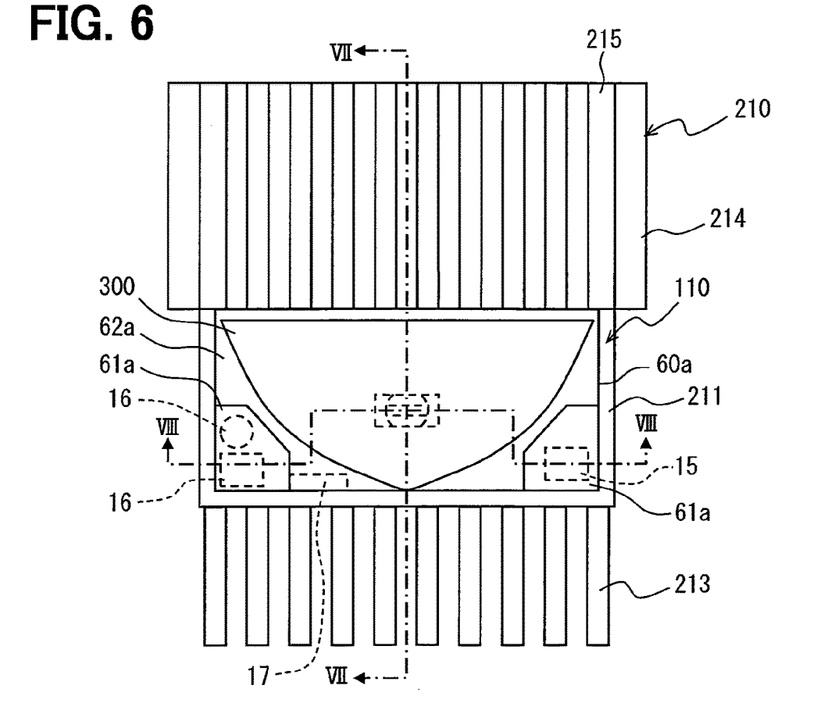
FIG. 6 is a top plan view illustrating a schematic configuration of a lighting device according to Modification 1.
Figure 7:
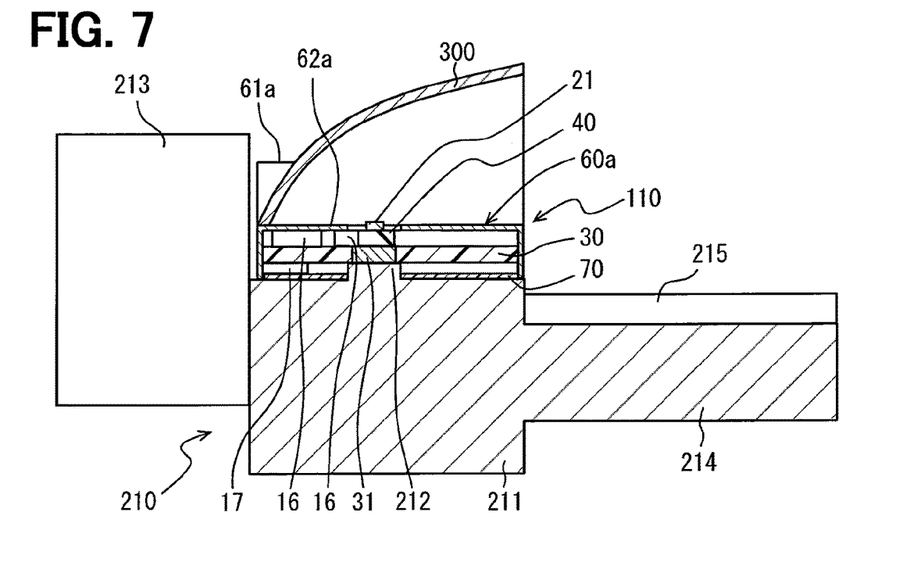
FIG. 7 is a cross-sectional view taken along a line VII-VII of FIG. 6.

Then, the lighting device 110 of Modification 1 will be described with reference to FIGS. 6 to 9. The lighting device 110 is applied to a vehicle headlight. Usually, the vehicle headlight reflects a light generated from a light source on a reflector for light distribution. Hence, as illustrated in FIGS. 6 and 7, the lighting device 110 is attached with a reflector 300 for reflecting the light generated from the LED 21. In FIG. 7, the leads 50 are omitted.

The reflector 300 is well-known, and has an inner surface as a reflective surface. The reflector 300 has a shape to cut a sphere into a quarter. Hence, as illustrated in FIG. 6, the reflector 300 is formed into a semicircular shape when viewed from a top in a state where the reflector 300 is fitted to the lighting device 110. In other words, the reflector 300 has an attaching portion for the lighting device 110, and a planar shape of the attaching portion is formed into a semicircular shape.

Figure 9:
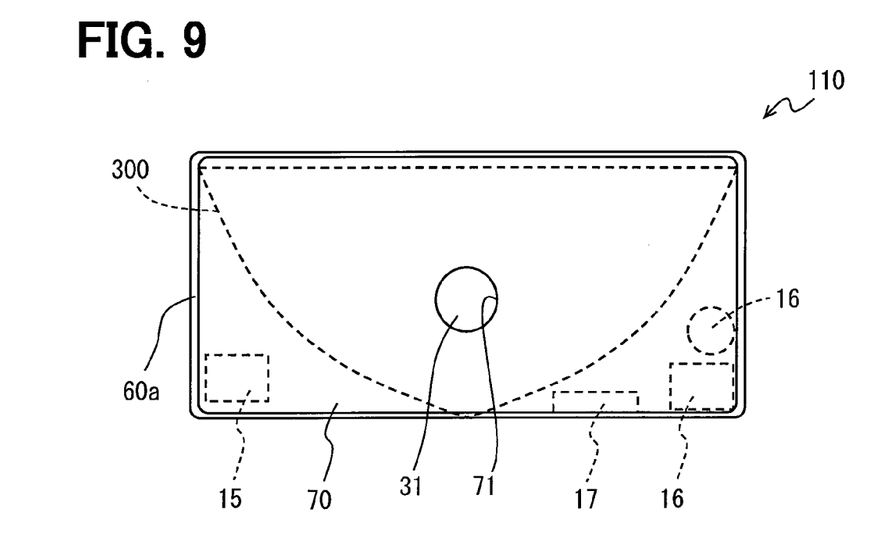
FIG. 9 is a top plan view illustrating the schematic configuration of the lighting device according to Modification 1.

As in the lighting device 100, the lighting device 110 includes a circuit unit 10, a light emitting unit 20, and a cover 70. The lighting device 110 is different in the shape of a case 60a from the lighting device 100. As illustrated in FIGS. 7 and 9, in the lighting device 110, a connector 17 that is an input/output connector of the lighting device 110 is fitted to an opposite surface of the circuit board 30.

Figure 8:
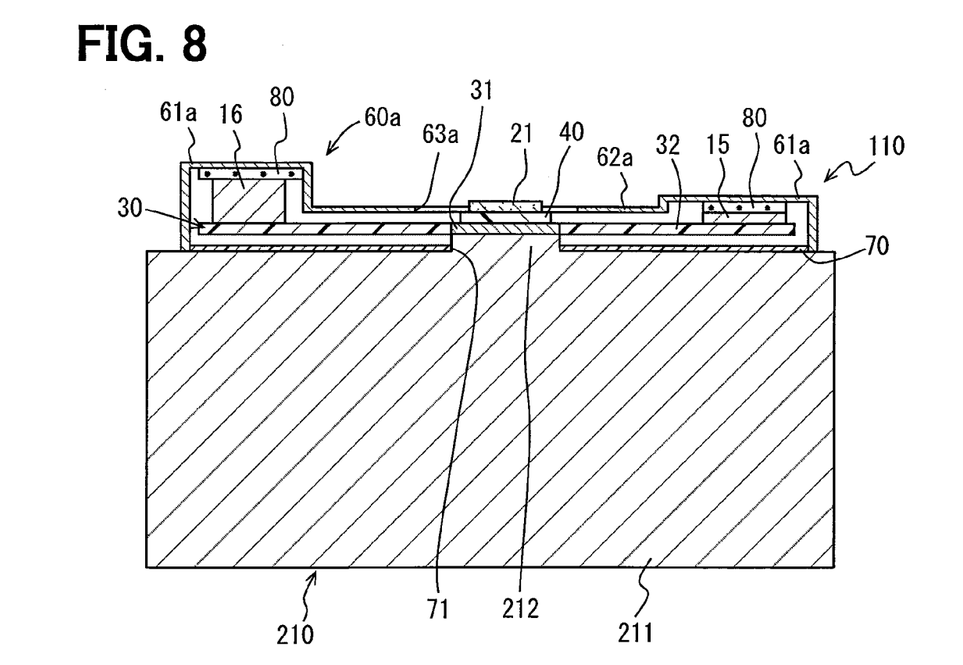
FIG. 8 is a cross-sectional view taken along a line VIII-VIII of FIG. 6.

As illustrated in FIGS. 6 to 8, the lighting device 110 is attached to a heat sink 210. As with the heat sink 200, the heat sink 210 is provided with a heat sink base 211 and a connection convex portion 212. Further, the heat sink 210 is provided with heat radiation fins 213, a protruding portion 214, and heat radiation projections 215 for improving the heat radiation. The heat sink 210 has the multiple heat radiation fins 213 projected from the heat sink base 211. In the heat sink 210, the protruding portion 214 formed with the multiple heat radiation projections 215 is projected from the heat sink base 211. A material of the heat sink 210 is the same as that of the heat sink 200.

As illustrated in FIGS. 6 to 8, the case 60a is formed with a convex portion 61a, a concave portion 62a, and an irradiation window 63a. The irradiation window 63a is the same as that of the irradiation window 63, and therefore its description will be omitted. The case 60a is attached with the reflector 300. In detail, the reflector 300 is fitted to an opposite surface of the case 60a to a bottom surface connected with circuit elements.

In detail, the reflector 300 is fitted onto the concave portion 62a of the case 60a. As illustrated in FIGS. 6 and 7, the case 60a is formed so that the convex portion 61a is disposed on an opposite side to the reflective surface of the reflector 300. For that reason, as illustrated in FIGS. 6 and 9, the circuit elements are implemented on the circuit board 30 so that the circuit elements are disposed on the opposite side to the reflective surface of the reflector 300 in a state where the reflector 300 is fitted to the case 60a.

As described above, in the lighting device 110, the reflector 300 is attached onto the case 60a. The reflector 300 has an attaching portion for the lighting device 110, and a planar shape of the attaching portion is formed into a semicircular shape. For that reason, a region opposite to the reflective surface of the reflector 300 becomes a dead space in a state where the reflector 300 is attached to the lighting device 110. Under the circumstances, the lighting device 110 is formed so that the convex portion 61a is disposed on an opposite side to the reflective surface of the reflector 300. Hence, the lighting device 110 can obtain the same effects as those of the lighting device 100 while effectively using the dead space. Similarly, in the above-mentioned embodiment and Modifications 3 to 5, the convex portion of the case may be disposed on the opposite side to the reflective surface of the reflector.

(Modification 2)

Figure 10:
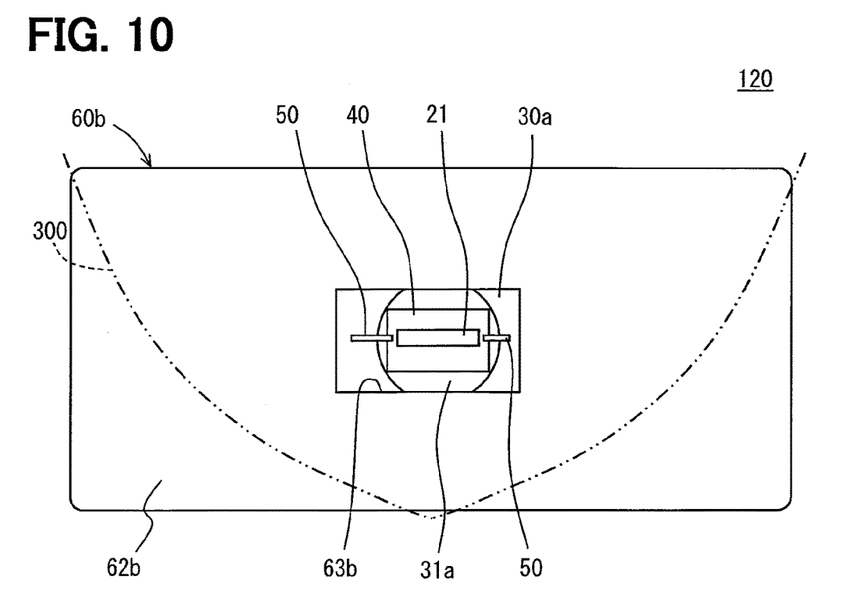
FIG. 10 is a top plan view illustrating a schematic configuration of a lighting device according to Modification 2.
Figure 11:
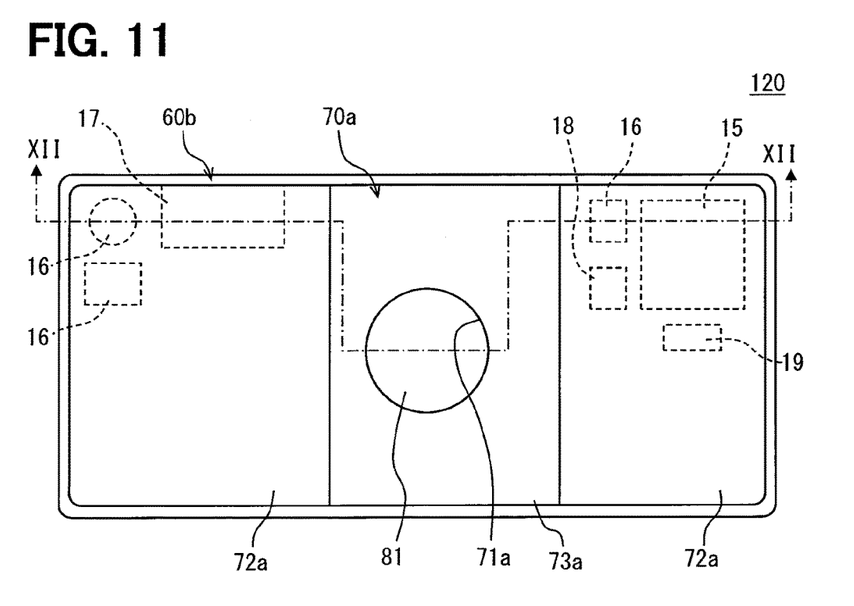
FIG. 11 is a bottom plan view illustrating the schematic configuration of the lighting device according to Modification 2.

Then, the lighting device 120 of Modification 2 will be described with reference to FIGS. 10 to 12. As in the lighting device 100, the lighting device 120 includes a circuit unit 10 and a light emitting unit 20. The lighting device 120 is different in the configuration of a circuit board 30a, the shape of a case 60a, and the shape of a cover 70a from the lighting device 100. Further, the lighting device 120 is different from the lighting device 100 in that circuit elements are implemented on an opposite surface of the circuit board 30a to a mounting surface on which the LED 21 is implemented. As illustrated in FIG. 11, in the lighting device 120, a diode 18 and a resistor 19 which are circuit elements are implemented on an opposite surface of the circuit board 30a.

The circuit board 30a includes a heat radiation member 31a, a board base 32a, and through-holes 33a. In other words, the circuit board 30a is different from the circuit board 30 in that the through-holes 33a are provided, and identical with the circuit board 30 in other configurations.

The through-holes 33a are provided to extend from a mounting surface of the board base 32a on which the LED 21 is implemented to a surface opposite to the mounting surface. The circuit elements are implemented on the opposite surface of the board base 32a.

As with the heat radiation member 31a, the through-holes 33a are made of copper or aluminum. However, the through-holes 33a are not limited to copper or aluminum. The through-holes 33a can be made of a metal higher in heat conduction (in other words, higher in thermal conductivity) than a material of the board base 32a. The through-holes 33a can be made of a material containing metal. Further, the through-holes 33a may be made of a conductive paste containing conductive particles.

Further, the through-holes 33a are connected with a circuit heat radiation agent 80 on a mounting surface side of the board base 32a, and connected with the circuit elements on the opposite surface side of the board base 32a. As described above, the through-holes 33a are members for connecting the circuit elements to the circuit heat radiation agent 80. Hence, the heat generated by the circuit elements is transmitted to the circuit heat radiation agent 80 through the through-holes 33a. As in the above-mentioned embodiment, the circuit heat radiation agent 80 is connected to a case 60b. With the above configuration, the heat generated by the circuit elements is transmitted to the case 60b through the through-holes 33a and the circuit heat radiation agent 80.

As described above, in the lighting device 120, the circuit elements are implemented on an opposite surface of the circuit board 30a to a mounting surface on which the LED 21 is implemented. Hence, the case 60b does not need to provide the convex portions 61 and the concave portion 62 unlike the case 60. The case 60b includes a bottom 62b and an irradiation window 63b. In detail, as illustrated in FIGS. 10 and 12, the case 60b is configured by a box-shaped member having a planar bottom 62b and an annular side wall projected from an end of the bottom surface. The case 60 is opened at a position facing the bottom 62b. In other words, the case 60 has an opening at the position facing the bottom 62b. The irradiation window 63b is the same as that of the irradiation window 63, and therefore its description will be omitted.

The bottom 62b of the case 60b is a site to which the reflector 300 is attached. As described above, the bottom 62b is formed in a flat. In other words, in the case 60b, a periphery of the irradiation window 63b is formed in a flat.

Figure 12:
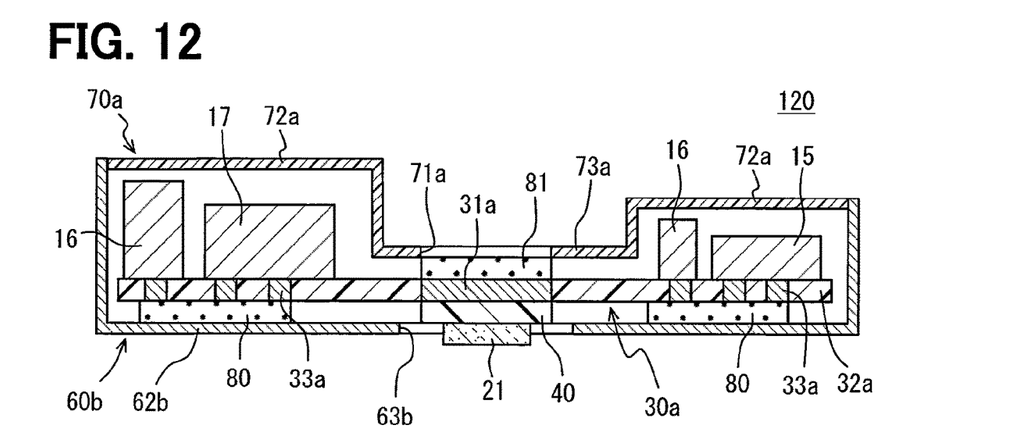
FIG. 12 is a cross-sectional view taken along a line XII-XII of FIG. 11.

On the other hand, as illustrated in FIGS. 11 and 12, the cover 70a has convex portions 72a formed in regions facing the circuit elements, and a concave portion 73a formed in the other region. In other words, the cover 70a has the convex portions 72a and the concave portion 73a formed according to the height of the circuit elements. The convex portions 72a are sites projected from the concave portion 73a. Hence, the concave portion 73a is a site recessed from the convex portions 72a. The cover 70a is provided with a contact window 71a as with the cover 70. A material of the cover 70a is the same as that of the cover 70.

The lighting device 120 configured as described above can obtain the same advantages as those of the lighting device 100. Further, the lighting device 120 can improve the mountability (in other words, mounting property) of the reflector 300 because the periphery of the irradiation window 63b in the case 60b can be flattened. In other words, the lighting device 120 can be attached to the case 60b without devising the shape of the reflector 300 and a process of fitting the shape of the reflector 300.

In Modification 2, the heat sink is not illustrated. However, as in the above-mentioned embodiment and the other modifications, the lighting device 120 may be attached to the heat sink. The heat radiation member 31a may be connected to the heat sink through a light source heat radiation agent 81. For example, the light source heat radiation agent 81 is disposed to completely cover a surface of the heat radiation member 31a facing the heat sink. With the use of the light source heat radiation agent 81 as described above, the lighting device 120 can improve the heat radiation of the LED 21. However, this disclosure is not limited to this configuration.

The light source heat radiation agent 81 is identical with the circuit heat radiation agent 80, and therefore its description will be omitted. The light source heat radiation agent can be also applied to the above-mentioned embodiment and the other modifications. For example, the heat radiation member 31 may be connected to the connection convex portion 202 of the heat sink 200 through the light source heat radiation agent.

(Modification 3)

Figure 13:
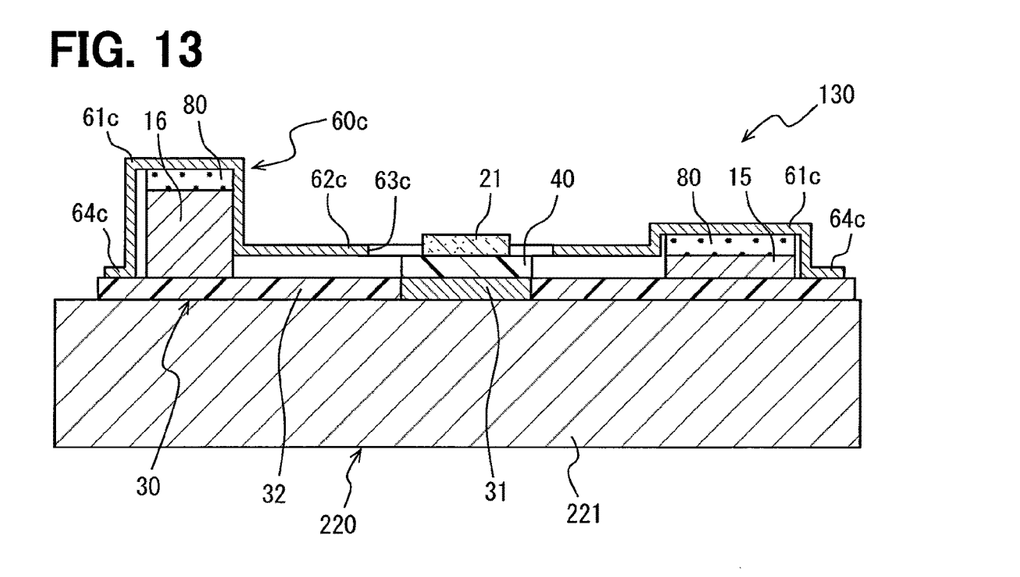
FIG. 13 is a cross-sectional view of a state in which a lighting device according to Modification 3 is fitted to a heat sink.

Then, the lighting device 130 of Modification 3 will be described with reference to FIG. 13. The lighting device 130 is different from the lighting device 100 in that no cover is provided.

As with the case 60, a case 60c includes a convex portion 61c, a concave portion 62c, and an irradiation window 63c. The case 60c also includes a flange 64c that is an attaching portion for a circuit board 30. Hence, the case 60c is fitted to the circuit board 30 with the connection of the flange 64 to the circuit board 30. The flange 64c can be connected to the circuit board 30 by a screw or adhesive.

The lighting device 130 has no cover. For that reason, a heat sink 220 attached with the lighting device 130 may not be provided with a connection convex portion on a heat sink base 221. A material of the heat sink 220 is the same as that of the heat sink 200.

The lighting device 130 configured as described above can obtain the same advantages as those of the lighting device 100. Further, the lighting device 130 can reduce the number of components more than that of the lighting device 100 because no cover is provided. Similarly, in the above-mentioned embodiment and the other modifications, the cover can be omitted. For example, the lighting device 110 can achieve the object even if the cover 70 is not provided.

(Modification 4)

Then, a lighting appliance provided with the lighting device 140 of Modification 4 will be described with reference to FIG. 14. The lighting appliance includes the lighting device 140 and a heat sink 230. The lighting device 140 is identical with the lighting device 100, and therefore its description will be omitted.

Figure 14:
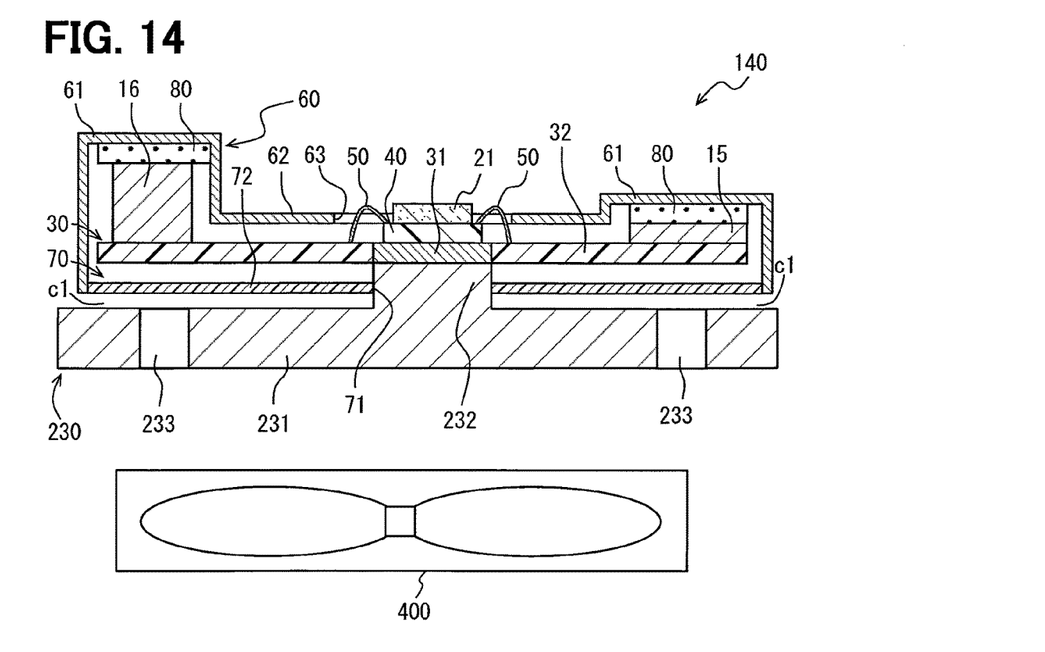
FIG. 14 is a cross-sectional view of a state in which a lighting device according to Modification 4 is fitted to a heat sink.

As illustrated in FIG. 14, the heat sink 230 receives a wind from a heat radiation fan 400. The heat sink 230 corresponds to an air-cooled heat sink. As with the heat sink 200, the heat sink 230 includes a heat sink base 231 and a connection convex portion 232. A material of the heat sink 230 is the same as that of the heat sink 200.

Further, blowing holes 233 penetrate through the heat sink 230 in a thickness direction of the heat sink 230. A wind supplied from the heat radiation fan 400 passes through the blowing holes 233. The blowing holes 233 are provided at positions facing circuit elements of the lighting device 140 in a state where the lighting device 140 is fitted to the heat sink 230.

The heat sink 230 is disposed so that clearances c1 that communicate with the respective blowing holes 233 are defined between the heat sink 230 and the lighting device 140 in a state where the lighting device 140 is fitted to the heat sink 230. The lighting device 140 includes the cover 70. For that reason, the clearances c1 are defined between the heat sink 230 and the cover 70. Hence, the wind from the heat radiation fan 400 is supplied to the heat sink 230, and also supplied to peripheries of electronic circuits through the clearances c1 and the blowing holes 233.

A positional relationship between the heat sink 230 and the heat radiation fan 400, and positions of the blowing holes 233 in the heat sink 230 are not limited to the above configuration. Any positional relationship between the heat sink 230 and the heat radiation fan 400 is acceptable if the wind can be supplied from the heat radiation fan 400 to the heat sink 230. Any position of the blowing holes 233 in the heat sink 230 is acceptable if the wind supplied from the heat radiation fan 400 can be supplied to the lighting device 140.

The lighting device 140 of the lighting appliance configured as described above can obtain the same advantages as those of the lighting device 100. In the lighting appliance, because the heat sink 230 receives the air blown from the heat radiation fan 400, the heat radiation of the LED 21 connected to the heat sink 230 can be improved. Further, in the lighting appliance, the air blown from the heat radiation fan 400 is supplied to the peripheries of the circuit elements through the clearances c1 and the blowing holes 233 provided in the heat sink 230. For that reason, the lighting appliance can improve the heat radiation of the circuit elements. Therefore, the lighting appliance is suitable for a case in which the LED 21 is required to provide luminance of the same degree as that of an HID lamp (high intensity discharge lamp) or an incandescent light bulb.

The lighting appliance can achieve the object even if the lighting devices 100 to 130, and 150 are fitted to the heat sink 230. In the lighting appliance in which the lighting device 130 is fitted to the heat sink 230, the clearances c1 are provided between the heat sink 230 and the circuit board 30.

(Modification 5)

Figure 15:
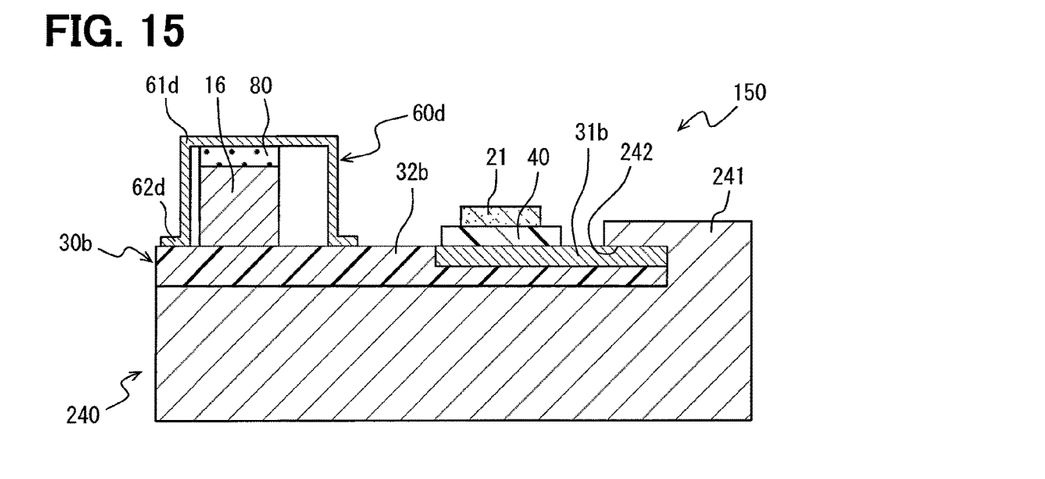
FIG. 15 is a cross-sectional view of a state in which a lighting device according to Modification 5 is fitted to a heat sink.

Then, the lighting device 150 of Modification 5 will be described with reference to FIG. 15. The lighting device 150 is different from the lighting device 100 in that the cover 70 is not provided. Further, the lighting device 150 is different in a structure of a circuit board 30b from the lighting device 100.

As with the circuit board 30, an LED 21 and circuit elements are implemented on the same surface of the circuit board 30b. In the circuit board 30b, a heat radiation member 31b is disposed in a board base 32b. As with the heat radiation member 31, the LED 21 is implemented over the heat radiation member 31b through an insulating member 40.

However, the heat radiation member 31b is disposed in the circuit board 30b without passing through the board base 32b in a thickness direction of the board base 32b. In other words, the heat radiation member 31b is embedded in the board base 32b, and exposed to a mounting surface of the board base 32b on which the LED 21 is implemented. Hence, the heat radiation member 31b is not exposed to a surface of the board base 32b opposite to the mounting surface.

A case 60d is different from the case 60 in that the concave portion 62 and the irradiation window 63 are not provided. The case 60d includes a convex portion 61d corresponding to the height of the circuit elements, and a flange 62d that is a mounting portion for the circuit board 30b. In other words, the case 60d is disposed to mainly cover the circuit elements. The case 60d can be also applied to the lighting devices 100, 130, and 140. As with the case 60, the case 60d having the irradiation window 63 can be also applied.

The lighting device 150 is preferably fitted to a heat sink 240. The heat sink 240 includes a heat sink base 241 and an attaching portion 242 that is a site to which the lighting device 150 is fitted, and which comes in contact with a heat radiation member 31d. The lighting device 150 is mounted on the heat sink base 241, and fitted to the attaching portion 242 while being partially sandwiched in the attaching portion 242. As described above, the lighting device 150 is sandwiched in the attaching portion 242, and the heat radiation member 31d is brought into contact with the heat sink 240. In other words, the lighting device 150 is fitted into the attaching portion 242, and fixed to the heat sink 240.

The lighting device 150 configured as described above can obtain the same advantages as those of the lighting devices 100 and 130. Further, the lighting device 150 is easily fitted to the heat sink 240. In other words, the lighting device 150 is merely fitted into the attaching portion 242 with the results that the heat radiation member 31d can be fitted to the heat sink 240 while being brought into contact with the heat sink 240.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A lighting device attached to a heat sink comprising:
   a light source;
   a drive circuit that drives the light source to emit a light, and includes a circuit element and a circuit board, on which the circuit element and the light source are arranged;
   a case that covers the drive circuit; and
   a cover, wherein:
   the circuit board includes a radiation member, disposed in a region where the light source is arranged, for radiating heat generated from the light source;
   the case is connected with the circuit element, and radiates heat generated from the circuit element;
   the case has a bottom surface connected with the circuit element, and an opening part facing the bottom surface;
   the cover has a connection window at a position facing the radiation member, is disposed between the heat sink and the circuit board, and covers the opening part; and
   the radiation member is connected to the heat sink through the connection window.

2. The lighting device according to claim 1, wherein:
   the radiation member is disposed to extend from a mounting surface of the circuit board, on which the light source is arranged, to an opposite surface to the mounting surface.

3. The lighting device according to claim 1, wherein:
   the radiation member is connected to the heat sink through a light source radiation agent.

4. The lighting device according to claim 1, wherein:
   the circuit element is connected to the case through a circuit heat radiation agent.

5. The lighting device according to claim 1, wherein:
   the circuit board has an insulating board base, on which the radiation member is disposed; and
   the light source is arranged on the radiation member through an insulating member, which has heat conduction higher than the insulating board base.

6. The lighting device according to claim 1, wherein:
   the light source and the circuit element are arranged on a same surface of the circuit board.

7. The lighting device according to claim 1, wherein:
   the circuit element is arranged on an opposite surface to a mounting surface of the circuit board (30a), on which the light source is arranged.

8. A lighting appliance comprising:
   the lighting device according to claim 1; and
   the heat sink, wherein:
   the heat sink is an air-cooled heat sink, to which a wind is supplied from a cooling fan; and
   the air-cooled heat sink includes a blowing hole, through which the wind supplied from the cooling fan passes, disposed at a position facing the circuit element, and a gap that communicates with the blowing hole, and is disposed between the air-cooled heat sink and the lighting device.

* * * * *